(12) United States Patent
Jung

(10) Patent No.: US 10,163,879 B2
(45) Date of Patent: Dec. 25, 2018

(54) SEMICONDUCTOR DEVICE HAVING JUMPER PATTERN

(71) Applicant: SAMSUNG ELECTRONICS CO., LTD., Suwon-si, Gyeonggi-do (KR)

(72) Inventor: Jong-Hoon Jung, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 14/874,989

(22) Filed: Oct. 5, 2015

(65) Prior Publication Data

US 2017/0098641 A1  Apr. 6, 2017

(51) Int. Cl.
| | |
|---|---|
| *H01L 23/535* | (2006.01) |
| *H01L 27/02* | (2006.01) |
| *H01L 23/522* | (2006.01) |
| *H01L 23/528* | (2006.01) |
| *H01L 27/088* | (2006.01) |
| *H01L 29/06* | (2006.01) |
| *H01L 29/78* | (2006.01) |
| *H01L 21/8234* | (2006.01) |

(52) U.S. Cl.
CPC .. *H01L 27/0207* (2013.01); *H01L 21/823475* (2013.01); *H01L 23/528* (2013.01); *H01L 23/5226* (2013.01); *H01L 27/088* (2013.01); *H01L 27/0886* (2013.01); *H01L 29/0649* (2013.01); *H01L 21/823437* (2013.01); *H01L 23/5221* (2013.01); *H01L 29/78* (2013.01)

(58) Field of Classification Search
CPC ........... H01L 29/66545; H01L 2924/00; H01L 2224/32225; H01L 23/5221; H01L 23/535; H01L 23/5381
See application file for complete search history.

(56) References Cited

U.S. PATENT DOCUMENTS

| | | | |
|---|---|---|---|
| 4,676,866 A | 6/1987 | Tang et al. | |
| 6,426,890 B1 | 7/2002 | Jasinski et al. | |
| 6,737,685 B2 | 5/2004 | Aipperspach et al. | |
| 8,173,491 B2 | 5/2012 | Law et al. | |
| 8,183,114 B2 | 5/2012 | Tsuboi et al. | |
| 8,399,928 B2 | 3/2013 | Ikegami et al. | |
| 8,592,872 B2 | 11/2013 | Becker et al. | |
| 8,741,763 B2 | 6/2014 | Ma et al. | |
| 8,762,911 B1 | 6/2014 | Lu | |
| 2007/0045736 A1* | 3/2007 | Yagishita | H01L 27/1203 257/347 |
| 2012/0256234 A1 | 10/2012 | Nishimura et al. | |
| 2013/0207198 A1 | 8/2013 | Becker et al. | |
| 2013/0334610 A1* | 12/2013 | Moroz | H01L 21/823821 257/369 |
| 2014/0027918 A1 | 1/2014 | Rashed et al. | |

(Continued)

*Primary Examiner* — Marcos D Pizarro
*Assistant Examiner* — Shannon Yi
(74) *Attorney, Agent, or Firm* — F. Chau & Associates, LLC

(57) ABSTRACT

According to an exemplary embodiment of the present inventive concept, a semiconductor device is provided as follows. An active region is disposed in one side of a gate line. A non-active region is disposed in the other side of the gate line. A jumper pattern crosses a top portion of the gate line, overlapping the active region and the non-active region. A boundary between the active region and the non-active region is underneath the gate line.

19 Claims, 19 Drawing Sheets

(56) References Cited

U.S. PATENT DOCUMENTS

| | | | |
|---|---|---|---|
| 2014/0042641 A1* | 2/2014 | Rashed | H01L 21/823871 257/775 |
| 2014/0077305 A1* | 3/2014 | Pethe | H01L 21/76895 257/368 |
| 2014/0124868 A1 | 5/2014 | Kamal et al. | |
| 2014/0167120 A1* | 6/2014 | Chi | H01L 27/0886 257/288 |
| 2015/0091067 A1* | 4/2015 | Pillarisetty | H01L 29/66477 257/288 |
| 2016/0155739 A1* | 6/2016 | Ting | H01L 29/0653 257/401 |
| 2017/0170120 A1* | 6/2017 | Leobandung | H01L 21/743 |

* cited by examiner

1200

1300

1400

SEMICONDUCTOR DEVICE HAVING JUMPER PATTERN

TECHNICAL FIELD

The present inventive concept relates to a semiconductor device.

DISCUSSION OF RELATED ART

Logic cells of a semiconductor device are provided as part of a standard-cell library to design a semiconductor integrated circuit structure for performing a particular function. The logic cells may be optimized to particular requirements and are pre-designed in various manners. The pre-designed logic cells are called standard cells. Such standard cells are used in designing semiconductor circuits.

In using standard cells, there is a limitation in a design rule. As integrated semiconductor devices shrink in size, a critical dimension of the design rule decreases, and a minimum distance between patterns is required to prevent electrical short between internal patterns. To secure the minimum distance, it is necessary to meet requirements including critical dimension uniformity, a line edge roughness (LER) of a pattern, and so on.

SUMMARY

According to an exemplary embodiment of the present inventive concept, a semiconductor device is provided as follows. An active region is disposed in one side of a gate line. A non-active region is disposed in the other side of the gate line. A jumper pattern crosses a top portion of the gate line, overlapping the active region and the non-active region. A boundary between the active region and the non-active region is underneath the gate line.

According to an exemplary embodiment of the present inventive concept, a semiconductor device is provided as follows. A first active fin and a second active fin are spaced apart from each other in a first direction. Each of the first active fin and the second active fin extends in the first direction. A third active fin is spaced apart from the first active fin in a second direction crossing the first direction. A trench is disposed between the first active fin and the second active fin. A field insulation layer is disposed in the trench. A jumper pattern is disposed on the first active fin, the third active fin and the field insulation layer. The jumper pattern connects electrically the first active fin and the third active fin.

BRIEF DESCRIPTION OF THE DRAWINGS

These and other features of the inventive concept will become more apparent by describing in detail exemplary embodiments thereof with reference to the accompanying drawings of which.

Figure 1:
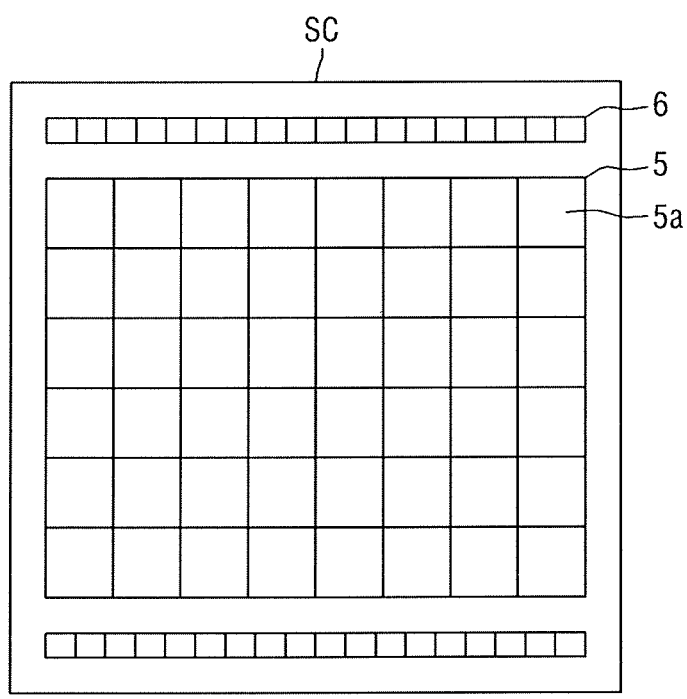
FIG. 1 is an exemplary layout view of a semiconductor chip including standard cells according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

As a semiconductor integrated circuit design is becoming complicated, a semi-custom design, which is a computer-based automatic design, is widely used. A semi-custom design refers to a method for developing a desired circuit by preparing a plurality of standard basic circuits in advance and automatically designing logic cells thereof using a computer. An exemplary semi-custom design is a design using a standard cell.

In a standard cell method, a complicated logic circuit formed by combining basic circuits is optimally designed and is pre-registered as a standard cell in the database of a computer. In a case of designing a semiconductor integrated circuit, a desired circuit may be implemented by combining various standard cells registered in the database. The respective standard cells have a constant cell height and appropriate standard cells are arranged in multiple columns, thereby designing an integrated circuit.

As an integration level of semiconductor integrated circuits is increases, shrinkage of a standard cell size is required. In general, the shrinkage of the standard cell size can be achieved by reducing sizes of transistors included in each standard cell. However, if the sizes of transistors included in each standard cell are uniformly reduced, desired functions may not be implemented. In general, since only the lowest level metal is used in the standard cell, the complexity in designing the lowest level metal may increase, resulting in an increase in the standard cell size.

If the standard cell layout according to the present inventive concept is employed, routing congestion of a plurality of metal wires may be avoided while reducing the standard cell size. For example, in the metal wire design, a space on a diffusion preventing region positioned in a lower layer is used, thereby increasing space utilization efficiency in the metal wire design. In addition, capacitance is lowered by reducing use of a back-end-of-line (BEOL) interconnector, thereby reducing power consumption and a gate delay.

Figure 2:
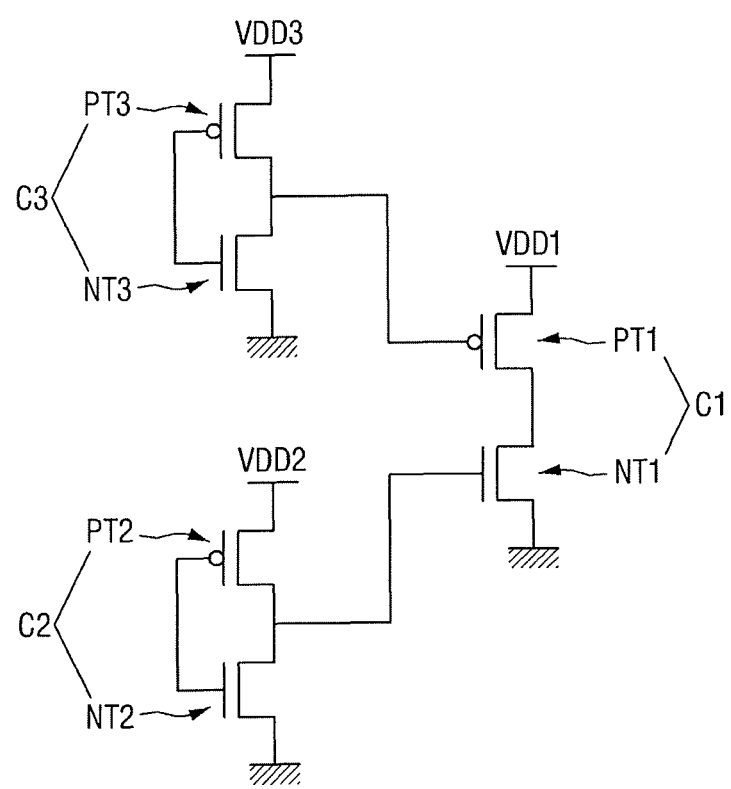
FIG. 2 is a circuit view of a single standard cell according to an exemplary embodiment of the present inventive concept.

FIG. 1 is an exemplary layout view of a semiconductor chip including standard cells, and FIG. 2 is a circuit view of a single standard cell.

Referring to FIG. 1, a semiconductor chip SC may include a standard cell region 5 and an input/output cell region 6. The semiconductor chip SC may include a plurality of standard cells 5a in the standard cell region 5. The semiconductor chip SC may include a pad in the input/output cell region 6 to receive/output a signal from/to the outside. The input/output cell region 6 may be formed around the standard cell region 5.

The plurality of standard cells 5a may be arranged in a matrix type in the standard cell region 5. A system on chip (SOC) may use a standard cell library, and a central processing unit (CPU), a random access memory (RAM), a first-in first-out (FIFO), a small computer system interface (SCSI), sea of gate (SOG), or the like, may be formed in the standard cell region 5.

An exemplary circuit formed in the standard cell 5a will now be described with reference to FIG. 2. For example, FIG. 2 illustrates a partial circuit of a buffer formed in the standard cell 5a. The partial circuit may include an output port and a driver. The output port may include, for example, a first CMOS inverter C1 including a first PMOS transistor PT1 and a first NMOS transistor NT1. The driver may include, for example, a second CMOS inverter C2 including a second PMOS transistor PT2 and a second NMOS transistor NT2, and a third CMOS inverter C3 including a third PMOS transistor PT3 and a third NMOS transistor NT3.

An output of the second CMOS inverter C2 including the second PMOS transistor PT2 and the second NMOS transistor NT2 may be applied to the first NMOS transistor NT1 as an input, and an output of the third CMOS inverter C3 including the third PMOS transistor PT3 and the third NMOS transistor NT3 may be applied to the first PMOS transistor PT1 as an input.

In the circuit shown in FIG. 2, if a high-level signal is input to the third CMOS inverter C3 and the second CMOS inverter C2, a high-level signal is also output from the first CMOS inverter C1 disposed at the output port. If a low-level signal is input to the third CMOS inverter C3 and the second CMOS inverter C2, a low-level signal is also output from the first CMOS inverter C1 disposed at the output port.

If a low-level signal is input to the third CMOS inverter C3 and a high-level signal is input to the second CMOS inverter C2, the first CMOS inverter C1 is put into a floating state. For example, the first CMOS inverter C1 is put into a high-impedance state.

Figure 3:
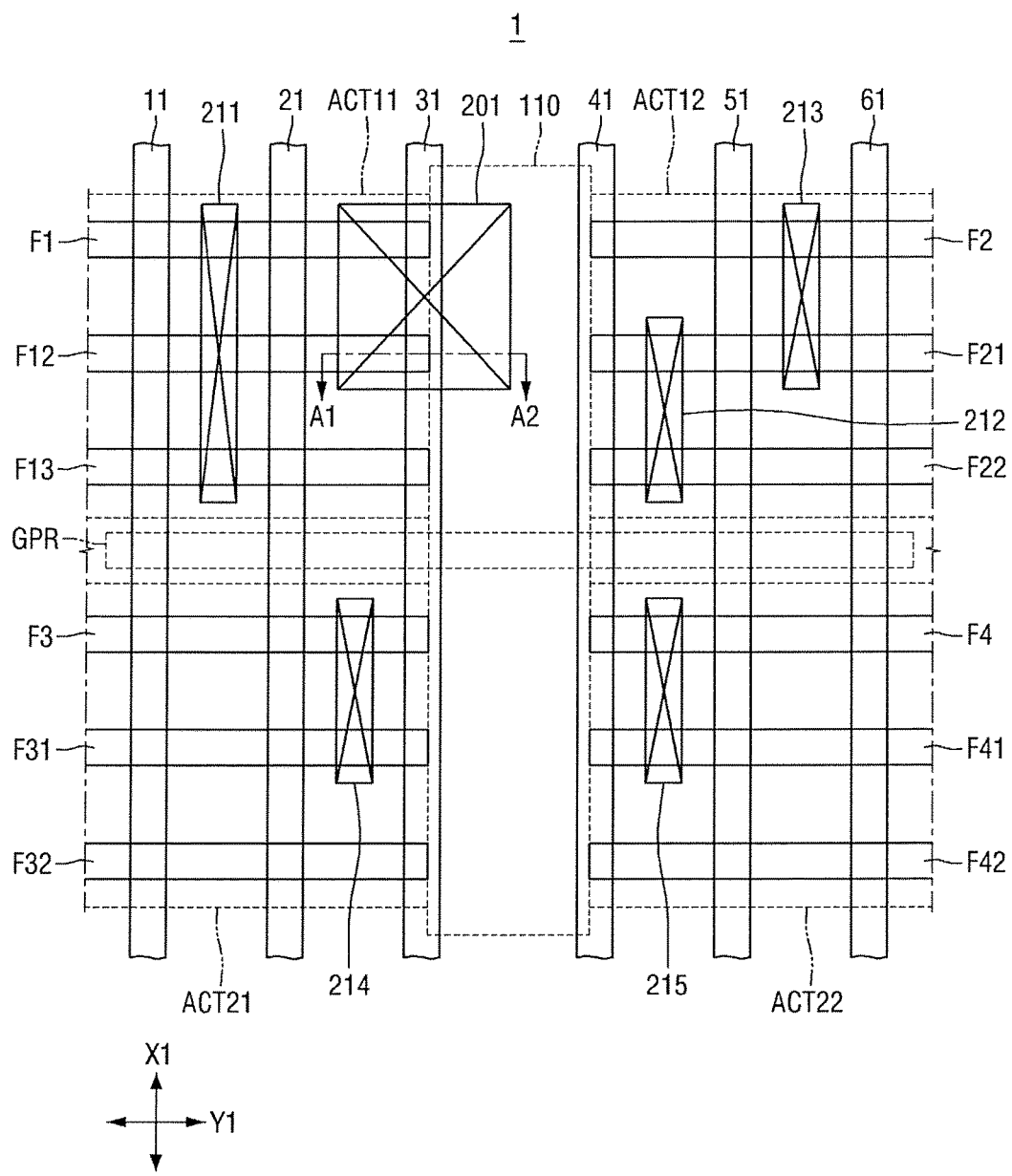
FIG. 3 is a layout view of a semiconductor device according to an exemplary embodiment of the present inventive concept.
Figure 4:
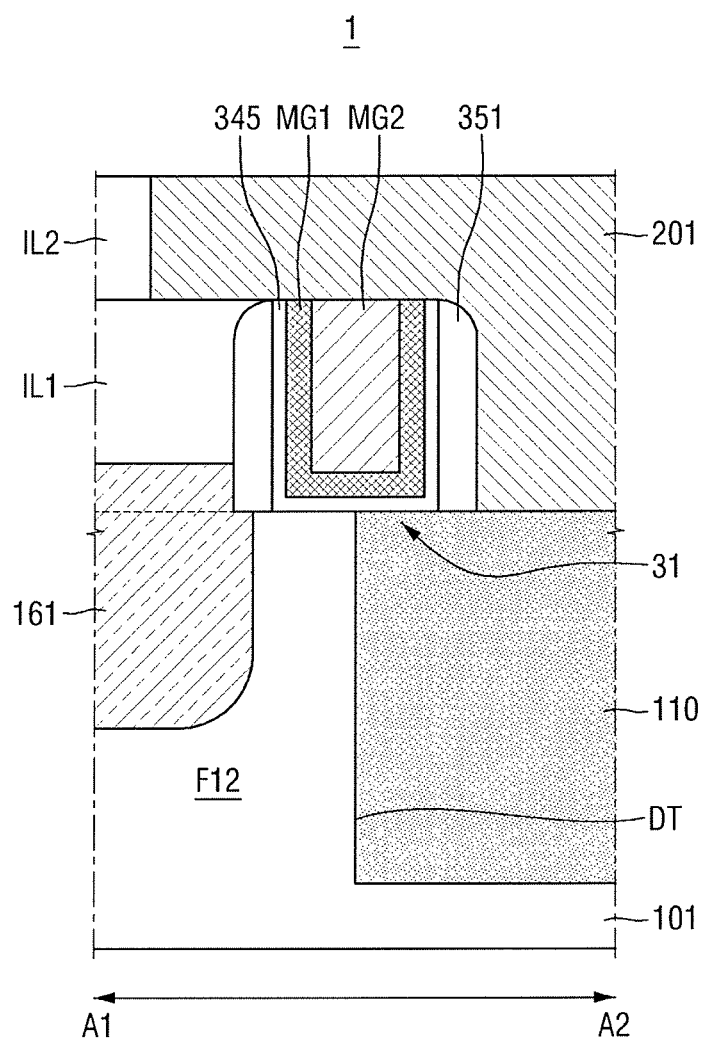
FIG. 4 is a cross-sectional view taken along line A1-A2 of FIG. 3.

FIG. 3 is a layout view of a semiconductor device according to an exemplary embodiment of the present inventive concept, and FIG. 4 is a cross-sectional view taken along line A1-A2 of FIG. 3.

Referring to FIGS. 3 and 4, the semiconductor device 1 may include a substrate 101, a first active region ACT11, a second active region ACT12, a third active region ACT21, a fourth active region ACT22, a gate pickup region GPR, first to sixth gate lines 11, 21, 31, 41, 51, and 61, a plurality of fins F1 to F4, F12, F13, F21, F22, F31, F32, F41, and F42, a first jumper pattern 201, and first to fifth contacts 211 to 215.

Here, the third gate line 31 and the fourth gate line 41 may be dummy gate lines, a diffusion preventing region may be disposed between the third gate line 31 and the fourth gate line 41, and a field insulation layer 110 may be formed in the diffusion preventing region.

As shown, the plurality of active regions ACT11, ACT12, ACT21, and ACT22 may be arranged in a matrix type, but aspects of the present inventive concept are not limited thereto. For example, the first active region ACT11 and the second active region ACT12 may be alternately arranged in a first direction X1. Alternatively, the first active region ACT11 and the third active region ACT21 may be alternately arranged in a second Y1. The field insulation layer 110 may be formed between the first active region ACT11 and the second active region ACT12 and between the third active region ACT21 and the fourth active region ACT22 to define active regions.

One or more fins F1 to F4, F12, F13, F21, F22, F31, F32, F41, and F42 may be arranged in the plurality of active regions ACT11, ACT12, ACT21, and ACT22. For example, the plurality of fins F1, F12, and F13 may be arranged in the first active region ACT11, the plurality of fins F2, F21, and F22 may be arranged in the second active region ACT12, the plurality of fins F3, F31, and F32 may be arranged in the third active region ACT21, and the plurality of fins F4, F41, and F42 may be arranged in the fourth active region ACT22.

The plurality of fins F1 to F4, F12, F13, F21, F22, F31, F32, F41, and F42 may extend lengthwise in a second direction Y1.

Some fins, (for example, F1 and F2) may be arranged to be spaced apart at a first distance d1 in a lengthwise direction (in the second direction Y1 in FIG. 3). Some fins (for example, F1, F12, and F13) may be arranged to be spaced apart at a second distance d2 in a widthwise direction (in the first direction X1 in FIG. 3).

For example, the second distance d2 between adjacent active regions (for example, between ACT11 and ACT21 or between ACT12 and ACT22) may be greater than the first distance d1 between the first fin F1 and the second fin F2, which are adjacent with each other in the lengthwise direction active region (for example, in the first direction Y1).

The plurality of gate lines 11, 21, 31, 41, 51, and 61 may extend lengthwise in the first direction X1. As described above, the third gate line 31 and the fourth gate line 41 as dummy gate lines may extend lengthwise in the first direction X1.

Referring to FIG. 3, the plurality of fins F1 to F4, F12, F13, F21, F22, F31, F32, F41, and F42 may extend lengthwise in the second direction Y1. The fins F1 to F4, F12, F13, F21, F22, F31, F32, F41, and F42 may be some portions of the substrate 101 or may include an epitaxial layer grown from the substrate 101. In FIG. 3, two fins F1 and F2 are arranged to be spaced apart from each other in the lengthwise direction. The present inventive concept is not limited thereto.

In FIG. 3, the fins F1 to F4, F12, F13, F21, F22, F31, F32, F41, and F42 shaped of rectangular parallelepiped are illustrated, but aspects of the present inventive concept are not limited thereto. For example, the fins F1 to F4, F12, F13, F21, F22, F31, F32, F41, and F42 may be chamfered. In chamfered fins, corners of the respective fins F1 to F4, F12, F13, F21, F22, F31, F32, F41, and F42 may be rounded. The fins F1 to F4, F12, F13, F21, F22, F31, F32, F41, and F42 may be active regions of a multi-gate transistor. The fins F1 to F4, F12, F13, F21, F22, F31, F32, F41, and F42 may be referred to as active patterns used in a multi-gate transistor. For example, channels may be connected to each other along three surfaces of each of the fins F1 to F4, F12, F13, F21, F22, F31, F32, F41, and F42. Alternatively, channels may be formed on two opposing surfaces of each of the fins F1 to F4, F12, F13, F21, F22, F31, F32, F41, and F42.

Referring to FIG. 4, a deep trench DT may be formed between the fin 12 and the fin 21, and the inside of the deep trench DT may be filled by the field insulation layer 110 to form a diffusion preventing region. The field insulation layer 110 may be formed on the substrate 101, filling the deep trench DT and contacting an end surface of each of the plurality of fins F1 to F4, F12, F13, F21, F22, F31, F32, F41, and F42.

Referring back to FIG. 3, the field insulation layer 110 may extend lengthwise in the first direction X1. The field insulation layer 110 may be an oxide layer, a nitride layer, an oxynitride layer, or a combination thereof. Unlike in FIG. 4, the field insulation layer 110 may be formed on only a portion of the trench DT.

The plurality of gate lines 11, 21, 31, 41, 51, and 61 may be formed to intersect the corresponding fins F1 to F4, F12, F13, F21, F22, F31, F32, F41, and F42 on the fins F1 to F4, F12, F13, F21, F22, F31, F32, F41, and F42. For example, the first to third gate lines 11, 21, and 31 may be formed on the first fin F1 and the fourth to sixth gate lines 41, 51, and 61 may be formed on the second fin F2.

The third gate line 31 may be formed on the corresponding field insulation layer 110. In addition, the fourth gate line 41 may be formed on the corresponding field insulation layer 110. The third gate line 31 may be formed on the fin F1, crossing the fin F1. The fourth gate line 41 may be formed on the fin F2, crossing the fin F2. As described above, a structure formed between adjacent fins (for example, between F1 and F2), including the field insulation layer 110 and two dummy gate lines formed thereon (that is, the third gate line 31 and the fourth gate line 41), may be referred to as a double diffusion break.

Referring back to FIG. 4, each gate line (for example, the gate line 31) may include metal layers MG1 and MG2. As shown, the third gate line 31 may include two or more metal layers MG1 and MG2 stacked one on another. The first metal layer MG1 may control a work function of a transistor and the second metal layer MG2 may fill a space formed by the first metal layer MG1. The first metal layer MG1 may include, for example, at least one of TiN, TaN, TiC, and TaC. In addition, the second metal layer MG2 may include, for example, W or Al. The third gate line 31 may be formed by, for example, a replacement process or a gate last process, but aspects of the present inventive concept are not limited thereto.

The dummy gate lines (for example, the third gate line 31 and the fourth gate line 41) may have structures similar to those of other gate lines 11, 21, 51, and 61. For example, the gate lines 11, 21, 51, and 61 may also include two or more metal layers MG1 and MG2 stacked one on another, like the dummy gate lines (for example, the third gate line 31 and the fourth gate line 41). For example, the first metal layer MG1 may control a work function of a transistor and the second metal layer MG2 may fill a space formed by the first metal layer MG1.

A gate insulation layer 345 may be formed between the fin F12 and each of the metal layers MG1 and MG2. The gate insulation layer 345 may include a high-k dielectric material having a higher dielectric constant than a silicon oxide layer. For example, the gate insulation layer 345 may include, for example, $HfO_2$, $ZrO_2$ or $Ta_2O_5$.

Sources/drains 161 may be disposed between two adjacent gate lines, or may be disposed between a gate line (e.g., 21) and the dummy gate line (e.g., 31).

The sources/drains 161 may be an elevated sources/drain protruding above a top surface of the fin F12.

In addition, the sources/drains 161 may be formed to partly overlap a spacer 351.

If the semiconductor device 1 of FIG. 4 is a P-type metal-oxide-semiconductor (PMOS) transistor, the sources/drains 161 may include a compressive stress material. For example, the compressive stress may include a material (for example, SiGe) having a larger lattice constant than Si. The compressive stress material may increase the mobility of carriers of a channel region by applying compressive stress to the fin F12.

If the semiconductor device 1 of FIG. 4 is an N type metal-oxide-semiconductor (NMOS) transistor, the sources/drains 161 may include the same material as the substrate 101 or a tensile stress material. For example, if the substrate 101 includes Si, the sources/drains 161 may include Si or a material (for example, SiC) having a smaller lattice constant than Si.

In an exemplary embodiment, the sources/drains 161 may be formed by doping impurity into the fin F12.

The spacer 351 may include at least one of a nitride layer and an oxynitride layer. The spacer 351 may insulate the metal layers MG1 and the MG2 and the sources/drains 161 from each other.

The substrate 101 may be, for example, a semiconductor substrate. The substrate 101 may include at least one of silicon, strained Si, silicon alloy, silicon carbide (SiC), silicon germanium (SiGe), silicon germanium carbide (SiGeC), germanium, germanium alloy, gallium arsenide (GaAs), indium arsenide (InAs), III-V semiconductor and II-VI semiconductor, a combination thereof, and a stacked layer thereof. In addition, the substrate 101 may be an organic plastic substrate. The following description will be made on the assumption that the substrate 100 includes silicon.

The substrate 101 may be of a P type or an N type. In some exemplary embodiments of the present inventive concept, an insulating substrate may be used as the substrate 101. For example, a silicon on insulator (SOI) substrate may be used as the substrate 101. In this case, the semiconductor device 1 may operate faster than a semiconductor device formed on a silicon substrate.

The gate pickup region GPR may be formed between the first active region ACT11 and the third active region ACT21 and between the second active region ACT12 and the fourth active region ACT22. The gate pickup region GPR may extend in the second direction Y1, for example. A gate pickup insulation layer and a gate pickup electrode may be additionally formed in the gate pickup region GPR. The gate pickup insulation layer may include silicon oxide. In addition, the gate pickup electrode may include a conductive material, such as doped polysilicon. For example, the gate pickup insulation layer may also be formed to surround bottom and side surfaces of the gate pickup electrode. In an exemplary embodiment, the gate pickup insulation layer may surround completely bottom and side surfaces of the gate pickup electrode.

The first jumper pattern 201 may be disposed to intersect a top portion of the third gate line 31, overlapping the first active region ACT11 and the field insulation layer 110. For example, the first jumper pattern 201 may be an interconnect pattern formed on the fin F1 and the fin F12, connecting the fin F1 and the fin F12 to each other.

Referring to FIG. 4, the first juniper pattern 201 may be formed on the field insulation layer 110 to cover the third gate line 31. A first interlevel insulation layer IL1 may be formed between the first jumper pattern 201 and the sources/drains 161. In addition, a second interlevel insulation layer IL2 may be formed on the first interlevel insulation layer IL1.

The first interlevel insulation layer IL1 and the second interlevel insulation layer IL2 may be used to electrically insulate the sources/drains 161 from the first jumper pattern 201. The first interlevel insulation layer IL1 and the second interlevel insulation layer IL2 may be formed using silicon oxide, such as borosilicate glass (BSG), phosphosilicate glass (PSG), borophosphosilicate glass (BPSG), undoped silicate glass (USG), tetraethyl orthosilicate (TEOS), or high density plasma-CVD (HDP-CVD). A top surface of the first interlevel insulation layer IL1 and a top surface of the third gate line 31 may be coplanar with each other.

The first to fifth contacts 211 to 215 may be used to electrically connect a plurality of fins. For example, the first contact 211 may be used to electrically connect the fins F1, F12, and F13 to each other, the second contact 212 may be used to electrically connect the fins F21 and F22 to each other, the third contact 213 may be used to electrically connect the fins F2 and F21 to each other, the fourth contact 214 may be used to electrically connect the fins F3 and F31, and the fifth contact 215 may be used to electrically connect the fins F4 and F41.

The first jumper pattern 201 may be connected to additional via contacts or metal wires to provide various signal routing paths for designing a standard cell structure. Accordingly, design complexity of the metal wires, cell capacitance may be lowered, or power consumption may be reduced.

Hereinafter, a semiconductor device according to an exemplary embodiment of the present inventive concept will be described.

Figure 5:
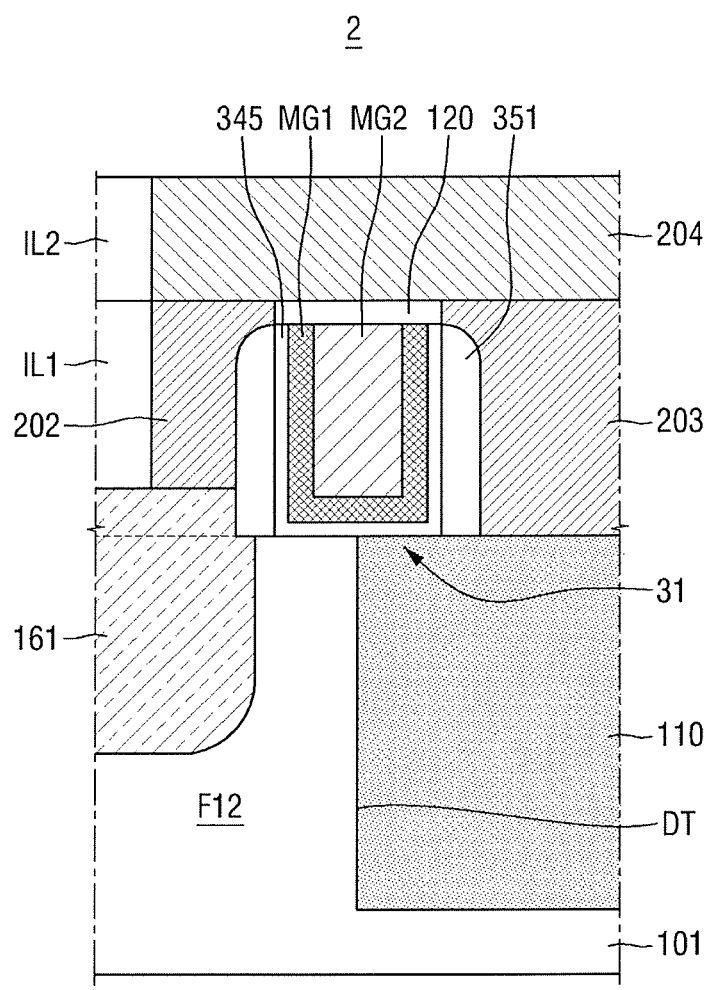
FIG. 5 is a cross-sectional view of a semiconductor device according to an exemplary embodiment of the present inventive concept.

FIG. 5 is a cross-sectional view of a semiconductor device according to an exemplary embodiment of the present inventive concept. For the sake of convenient description, descriptions of substantially the same content as that of the semiconductor device 1 of FIGS. 3 and 4 will be omitted.

The first jumper pattern 201 may be connected to additional via contacts or metal wires to provide a variety of signal routing paths for designing a semiconductor device using a standard cell structure. Accordingly, design complexity of the metal wires, cell capacitance may be lowered, or power consumption can be reduced.

Hereinafter, a semiconductor device according to an exemplary embodiment of the present inventive concept will be described.

Referring to FIG. 5, the semiconductor device 2 may include a first jumper pattern 201 including a first contact pattern 202, a second contact pattern 203, and a first bridge pattern 204, and a blocking pattern 120 may be formed between the first bridge pattern 204 and the third gate line 31.

The first contact pattern 202 and the second contact pattern 203 may vertically pass through a first interlevel insulation layer IL1 and a second interlevel insulation layer IL2 to be in contact with a source/drain 161 adjacent to a side portion of the third gate line 31. The first contact pattern 202 and the second contact pattern 203 may further include a barrier layer. The barrier layer may include titanium (Ti), titanium nitride (TiN), tantalum (Ta), tantalum nitride (TaN), titanium tungsten (TiW) or other barrier metals.

A contact electrode may be formed on the barrier layer, and the contact electrode may include titanium (Ti), titanium nitride (TiN), an aluminum compound, a tungsten compound, tungsten (W), copper (Cu) or other metals. The first contact pattern 202 and the second contact pattern 203 may include the barrier layer and the contact electrode.

The first bridge pattern 204 may electrically connect the first contact pattern 202 and the second contact pattern 203. In an exemplary embodiment, the first bridge pattern 204 may include a barrier layer and a contact electrode. As described above, the barrier layer may include titanium (Ti), titanium nitride (TiN), tantalum (Ta), tantalum nitride (TaN), titanium tungsten (TiW) or other barrier metal, and the contact electrode may include titanium (Ti), titanium nitride (TiN), an aluminum compound, a tungsten compound, tungsten (W), copper (Cu) or other metals.

The first bridge pattern 204 may be in direct contact with a blocking pattern 120. The lowest surface of the first bridge pattern 204 may have a width greater than that of the blocking pattern 120 to be in contact with the contact patterns 202 and 203.

The blocking pattern 120 may include a conductive material. For example, the blocking pattern 120 may include metal having higher resistance than the second metal layer. MG2. The blocking pattern 120 may include tungsten silicide (WSi), titanium nitride (TiN), tantalum nitride (TaN), titanium silicide nitride (TiSiN), or tantalum silicide nitride (TaSiN).

Figure 6:
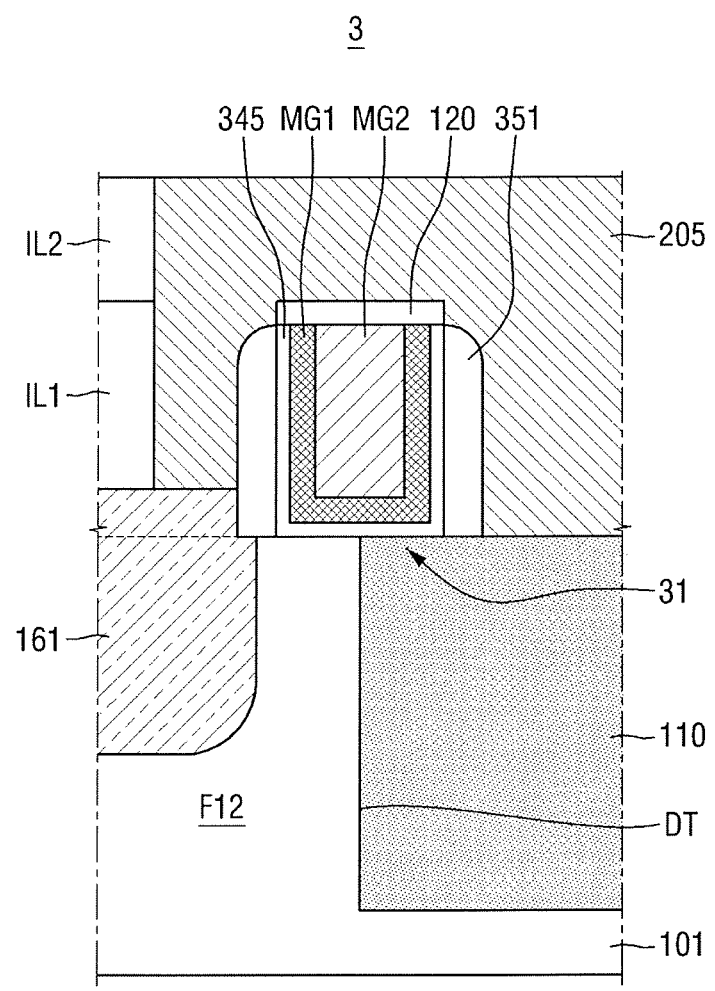
FIG. 6 is a cross-sectional view of a semiconductor device according to an exemplary embodiment of the present inventive concept.

FIG. 6 is a cross-sectional view of a semiconductor device according to an exemplary embodiment of the present inventive concept. For the sake of convenient description, descriptions of substantially the same content as that of the semiconductor devices FIGS. 4 and 5 will be omitted.

Referring to FIG. 6, the semiconductor device 3 may include a second jumper pattern 205 which is in contact with a blocking pattern 120, a source/drain 161 and the field insulation layer 110. In this case, a top surface and sidewalls of the blocking pattern 120 may be surrounded by the jumper pattern 205.

For example, the first contact pattern 202, the second contact pattern 203 and the first bridge pattern 204 of FIG. 5 may be integrally formed into the second jumper pattern 205. The second jumper pattern 205 is formed to intersect a top portion of the third gate line 31, and the blocking pattern 120 may be formed between the second jumper pattern 205 and the third gate line 31.

Figure 7:
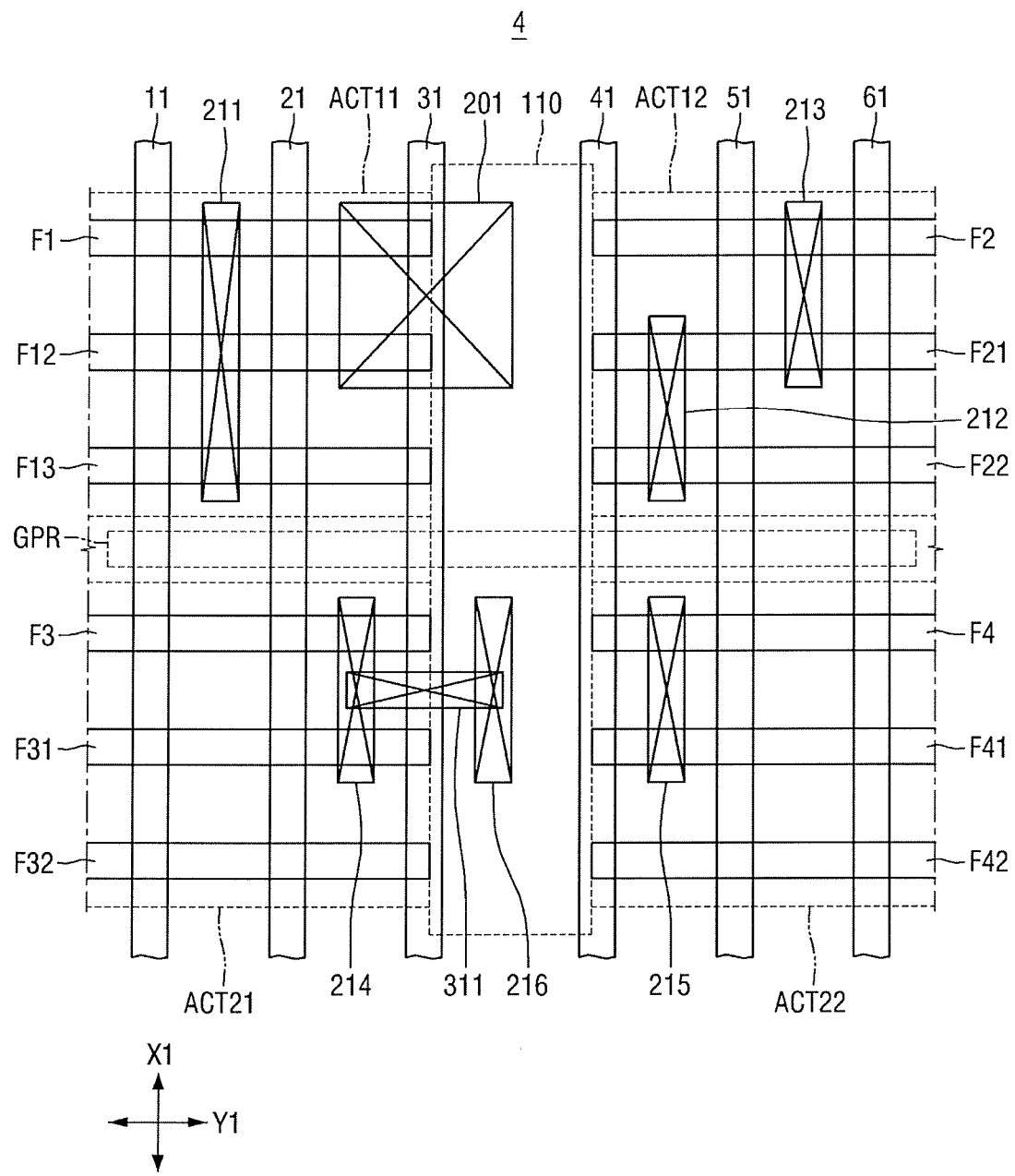
FIG. 7 is a layout view of a semiconductor device according to an exemplary embodiment of the present inventive concept.

FIG. 7 is a layout view of a semiconductor device according to an exemplary embodiment of the present inventive concept. For the sake of convenient description, descriptions of substantially the same content as that of the semiconductor devices of FIGS. 4, 5 and 6 will be omitted.

Referring to FIG. 7, the semiconductor device 4 may include a substrate 101, a first active region ACT11, a second active region ACT12, a third active region ACT21, a fourth active region ACT22, a gate pickup region GPR, first to sixth gate lines 11, 21, 31, 41, 51, and 61, a plurality of fins F1 to F4, F12, F13, F21, F22, F31, F32, F41, and F42, a first jumper pattern 201, first to sixth contacts 211 to 216, and a second bridge pattern 311.

The second bridge pattern 311 may electrically connect the fourth contact 214 and the sixth contact 216. The fourth contact 214, the sixth contact 216, and the second bridge pattern 311 may form an U-shaped connection.

The fourth contact 214 may electrically connect the fin F31 and the fin F32 to each other, and the sixth contact 216 may be formed on the field insulation layer 110. The fourth contact 214 and the sixth contact 216 may include titanium (Ti), titanium nitride (TiN), an aluminum compound, a tungsten compound, tungsten (W), copper (Cu) or other metals. In an exemplary embodiment, metal wires may be formed on the second bridge pattern 311 through a via contact to provide a signal routing path.

Figure 8:
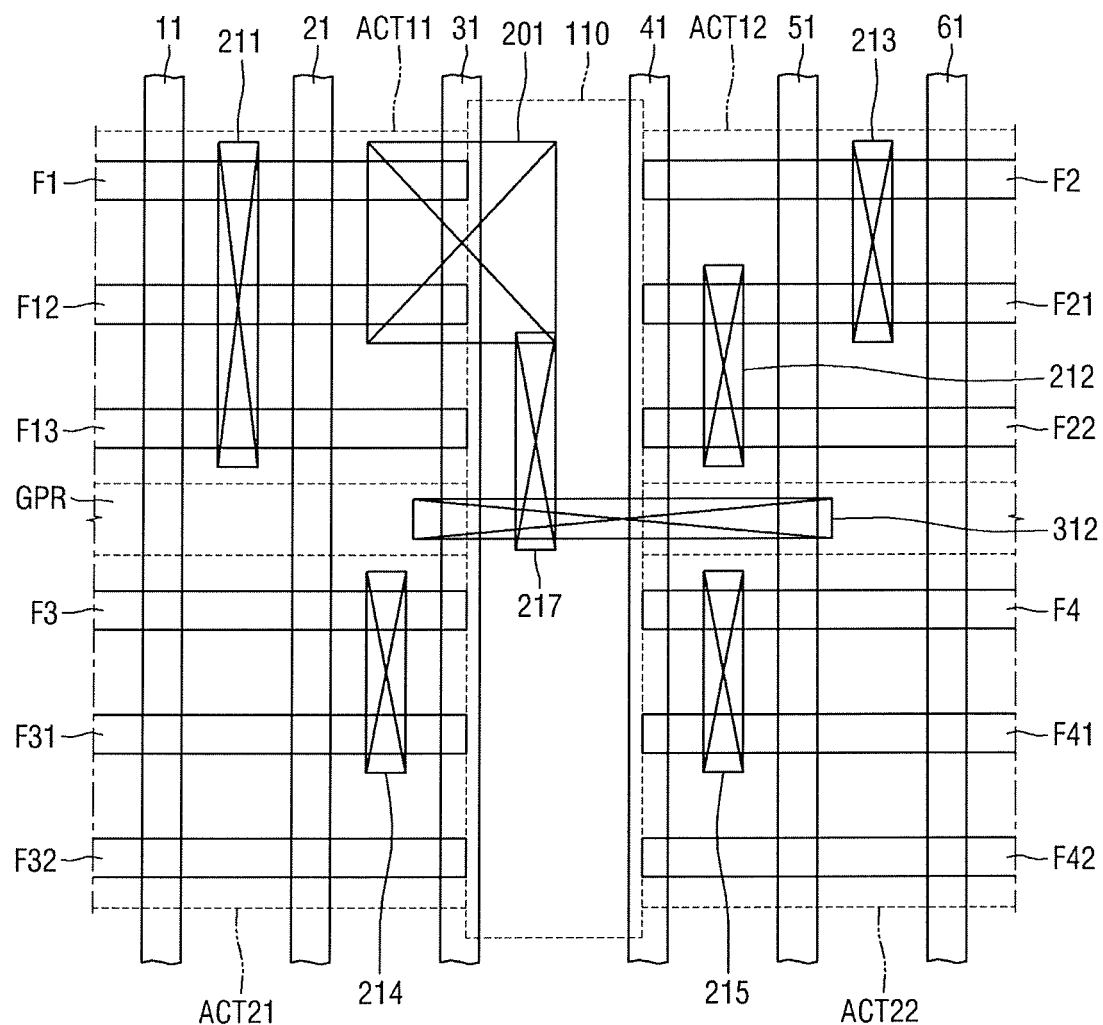
FIG. 8 is a layout view of a semiconductor device according to an exemplary embodiment of the present inventive concept.

FIG. 8 is a layout view of a semiconductor device according to an exemplary embodiment of the present inventive concept. For the sake of convenient explanation, descriptions of substantially the same content as that of the semiconductor devices of FIGS. 4 to 7 will be omitted.

Referring to FIG. 8, the semiconductor device 5 may include a substrate 101, a first active region ACT11, a second active region ACT12, a third active region ACT21, a fourth active region ACT22, a gate pickup region GPR, first to sixth gate lines 11, 21, 31, 41, 51, and 61, a plurality of fins F1 to F4, F12, F13, F21, F22, F31, F32, F41, and F42, a first jumper pattern 201, first to fifth contacts 211 to 215, a first connection pattern 217, and a first gate fin 312.

The first connection pattern 217 is a conductive pattern formed only on the field insulation layer 110 without overlapping the first to fourth active regions ACT11, ACT12, ACT21, and ACT22. The first connection pattern 217 may electrically connect the first jumper pattern 201 and the first gate fin 312.

The first gate fin 312 may be formed in the gate pickup region GPR and may intersect the third to fifth gate lines 31, 41, and 51. The first gate fin 312 may be used to pick up the fifth gate line 51, and a via contact and a metal wire may be formed on the fifth gate line 51 to be used in designing a standard cell.

Figure 9:
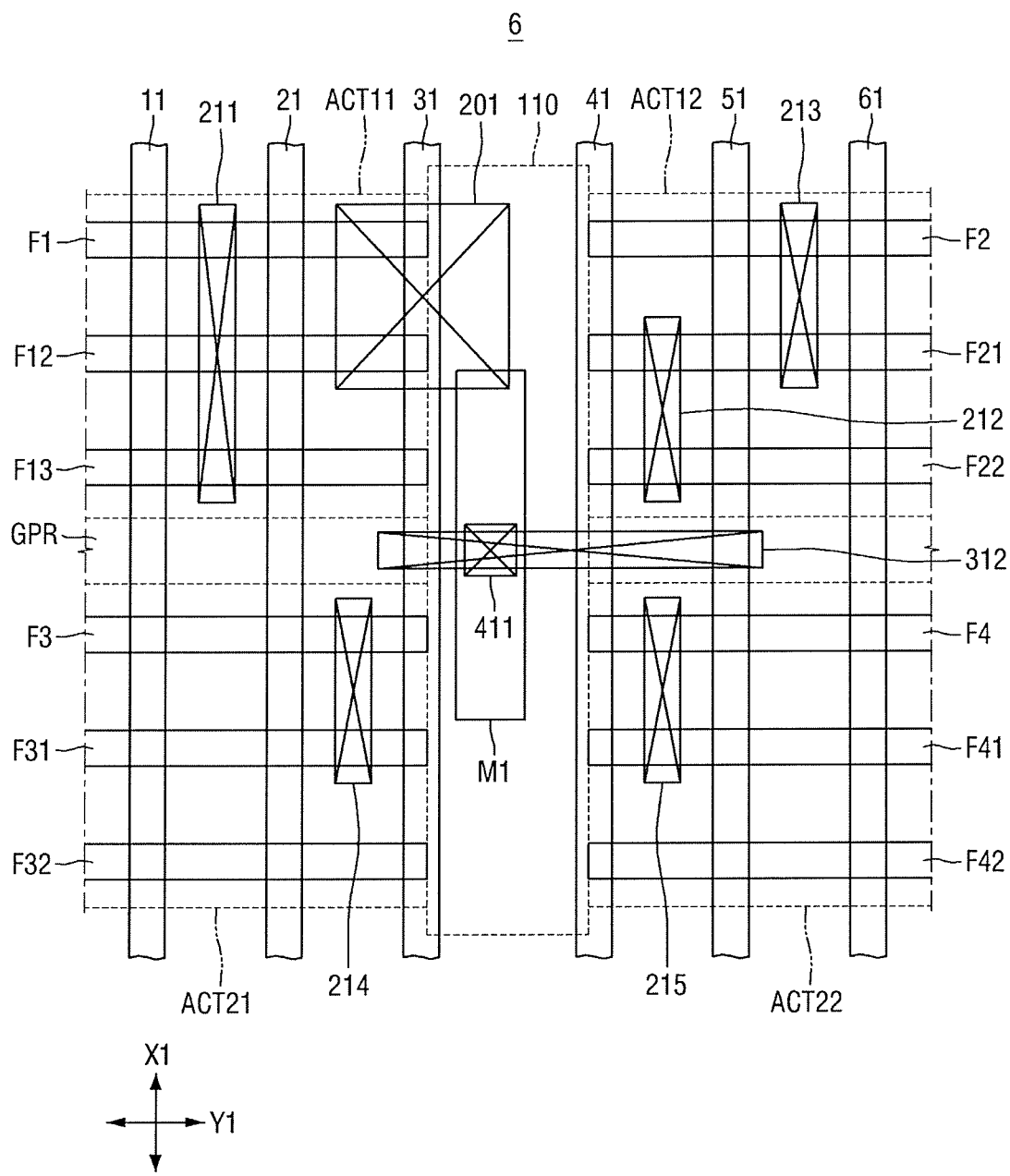
FIG. 9 is a layout view of a semiconductor device according to an exemplary embodiment of the present inventive concept.

FIG. 9 is a layout view of a semiconductor device according to an exemplary embodiment of the present inventive concept. For the sake of convenient description, descriptions of substantially the same content as that of the semiconductor devices 1-5 of FIGS. 4-8 will be omitted.

Referring to FIG. 9, the semiconductor device 6 may include a substrate 101, a first active region ACT11, a second active region ACT12, a third active region ACT21, a fourth active region ACT22, a gate pickup region GPR, first to sixth gate lines 11, 21, 31, 41, 51, and 61, a plurality of fins F1 to F4, F12, F13, F21, F22, F31, F32, F41, and F42, a first jumper pattern 201, first to fifth contacts 211 to 215, a first gate fin 312, a first via contact 411, and a first metal wire M1.

The first gate fin 312 may be formed in the gate pickup region GPR and may intersect the third to fifth gate lines 31, 41, and 51. The first gate fin 312 may be used to pick up the fifth gate line 51. A first via contact 411 may be formed on a region where the first gate fin 312 overlaps the field insulation layer 110, and a first metal wire M1 may be formed on the first via contact 411. Using connection structures including the first metal wire M1, the first via contact 411 and the first gate fin 312, the fifth gate line 51 is connected electrically to the 201.

Figure 10:
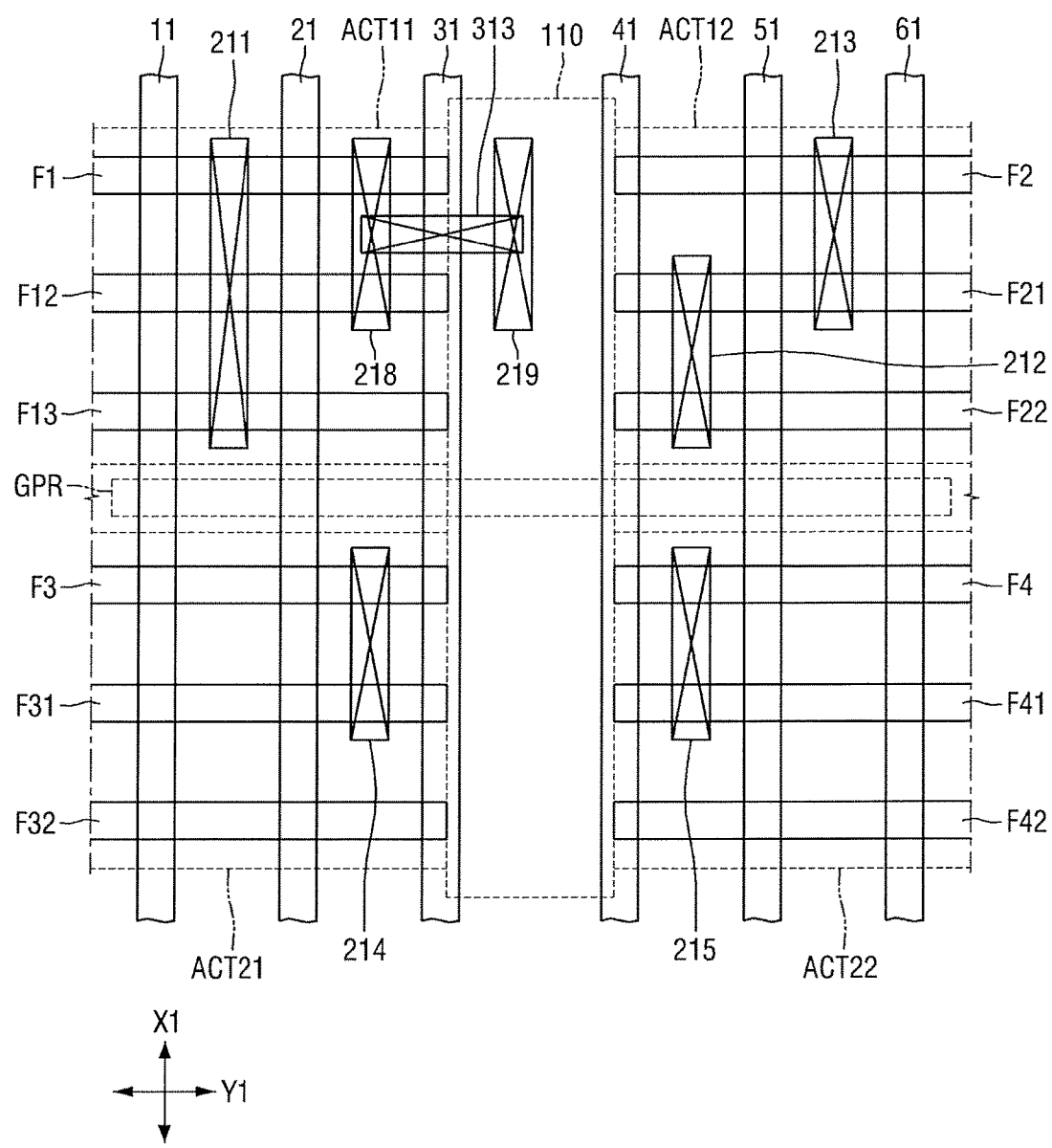
FIG. 10 is a layout view of a semiconductor device according to an exemplary embodiment of the present inventive concept.

FIG. 10 is a layout view of a semiconductor device according to an exemplary embodiment of the present inventive concept. For the sake of convenient description, the description of substantially the same content as that of the semiconductor devices 1 to 6 of FIGS. 4 to 9 will be given.

Referring to FIG. 10, the semiconductor device 7 may include a substrate 101, a first active region ACT11, a second active region ACT12, a third active region ACT21, a fourth active region ACT22, a gate pickup region GPR, first to sixth gate lines 11, 21, 31, 41, 51, and 61, a plurality of fins F1 to F4, F12, F13, F21, F22, F31, F32, F41, and F42, first to fifth contacts 211 to 215, a seventh contact 218, an eighth contact 219, and a third bridge pattern 313.

The seventh contact 218 may be formed in the first active region ACT11 and may electrically connect the fin F1 and the fin F12. The eighth contact 219 may be formed in the field insulation layer 110 and may be formed to be adjacent with the seventh contact 218. The seventh contact 218 and the eighth contact 219 may include titanium (Ti), titanium nitride (TiN), an aluminum compound, a tungsten compound, tungsten (W), copper (Cu) or other metals. The third bridge pattern 313 may electrically connect the seventh contact 218 and the eighth contact 219. Metal wires may formed on the third bridge pattern 313 through a via contact to provide a signal routing path.

Figure 11:
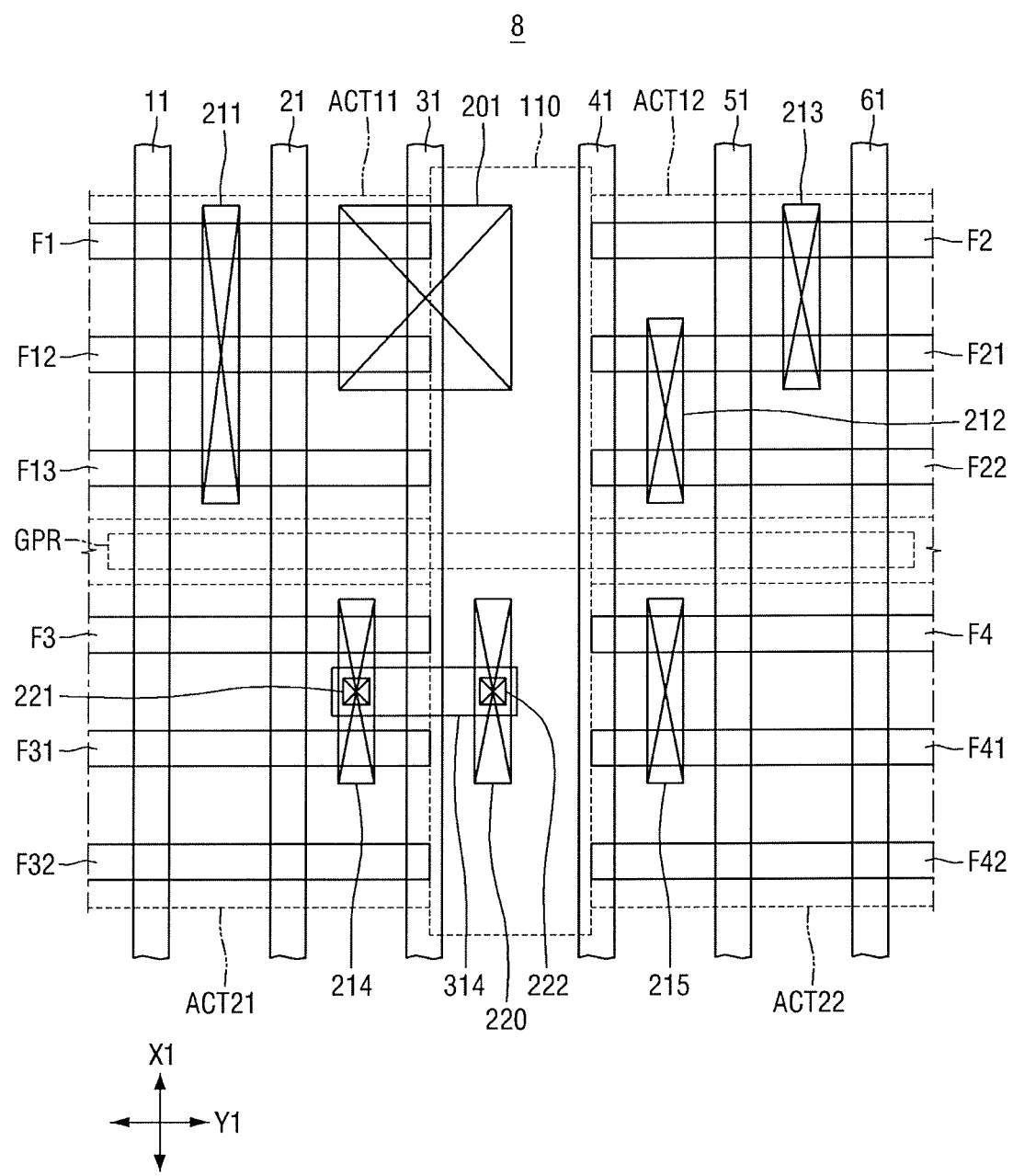
FIG. 11 is a layout view of a semiconductor device according to an exemplary embodiment of the present inventive concept.

FIG. 11 is a layout view of a semiconductor device according to an exemplary embodiment of the present inventive concept. For the sake of convenient description, descriptions of substantially the same content as that of the semiconductor devices 1 to 7 of FIGS. 4 to 10 will be omitted.

Referring to FIG. 11, the semiconductor device 8 may a substrate 101, a first active region ACT11, a second active region ACT12, a third active region ACT21, a fourth active region ACT22, a gate pickup region GPR, first to sixth gate lines 11, 21, 31, 41, 51, and 61, a plurality of fins F1 to F4, F12, F13, F21, F22, F31, F32, F41, and F42, a first jumper pattern 201, first to fifth contacts 211 to 215, a ninth contact 220, a second via contact 221, a third via contact 222, and a fourth bridge pattern 314.

The fourth contact 214 may be formed in the third active region ACT21 and may electrically connect the fin F3 and the fin F31. The ninth contact 220 may be formed in the field insulation layer 110 and may be formed to be adjacent with the fourth contact 214. The fourth contact 214 and the ninth contact 220 may include titanium (Ti), titanium nitride (TiN), an aluminum compound, a tungsten compound, tungsten (W), copper (Cu) or other metals.

The fourth bridge pattern 314 may electrically connect the fourth contact 214 and the ninth contact 220, and the fourth bridge pattern 314 and the fourth contact 214 may be electrically connected through the second via contact 221. In addition, the fourth bridge pattern 314 may be electrically connected to the ninth contact 220 through the third via contact 222.

Figure 12:
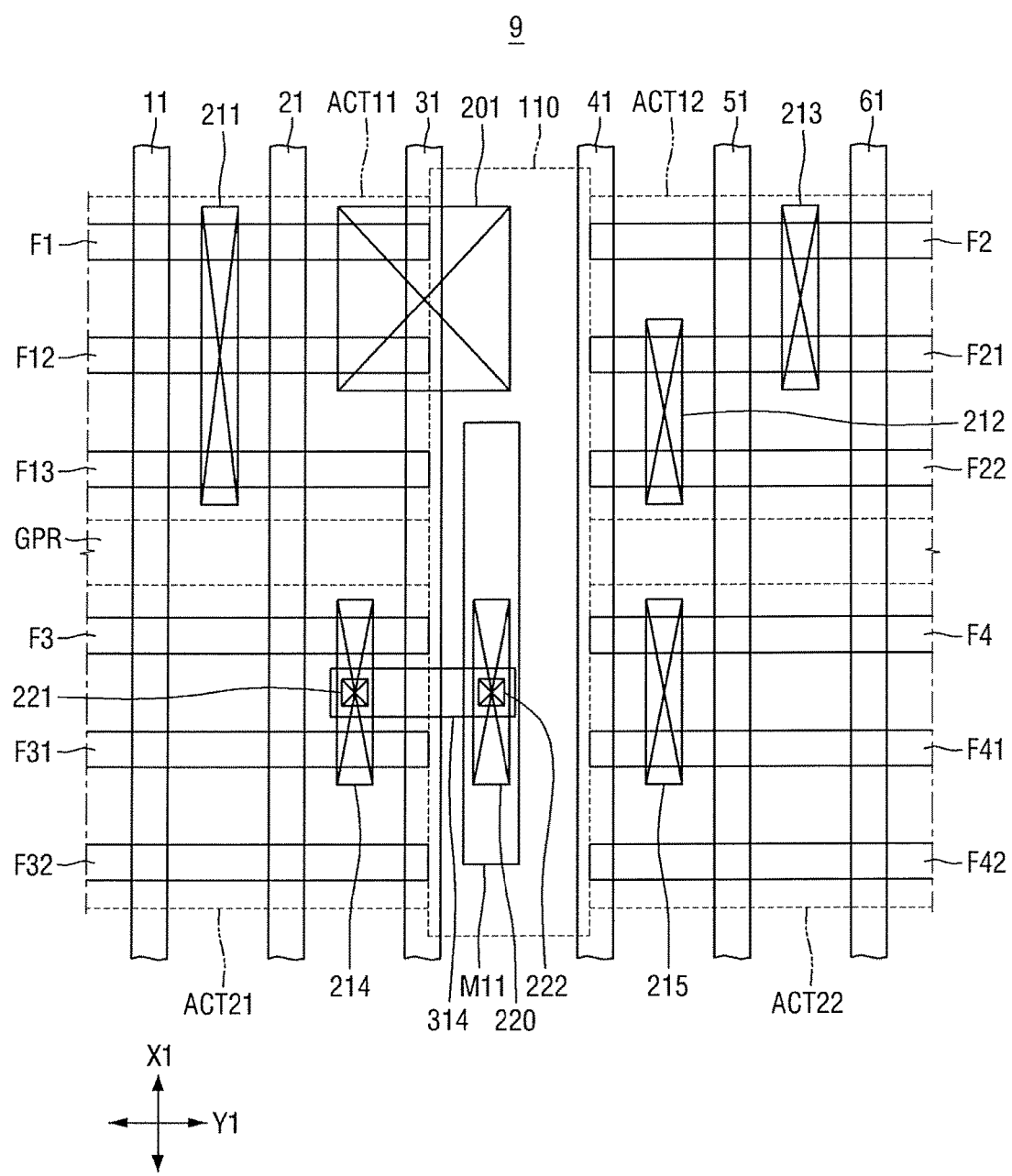
FIG. 12 is a layout view of a semiconductor device according to an exemplary embodiment of the present inventive concept.

FIG. 12 is a layout view of a semiconductor device according to an exemplary embodiment of the present inventive concept. For the sake of convenient description, descriptions of substantially the same content as that of the semiconductor devices 1 to 8 of FIGS. 4 to 11 will be given.

Referring to FIG. 12, the semiconductor device 9 may include a substrate 101, a first active region ACT11, a second active region ACT12, a third active region ACT21, a fourth active region ACT22, a gate pickup region GPR, first to sixth gate lines 11, 21, 31, 41, 51, and 61, a plurality of fins F1 to F4, F12, F13, F21, F22, F31, F32, F41, and F42, a first jumper pattern 201, first to fifth contacts 211 to 215, a ninth contact 220, a second via contact 221, a third via contact 222, a fourth bridge pattern 314, and a second metal wire M11.

The second metal wire M11 may be formed only on the field insulation layer 110, overlapping only the field insulation layer 110. The second metal wire M11 is electrically connected to the fourth bridge pattern 314, thereby providing a signal routing path.

Figure 13:
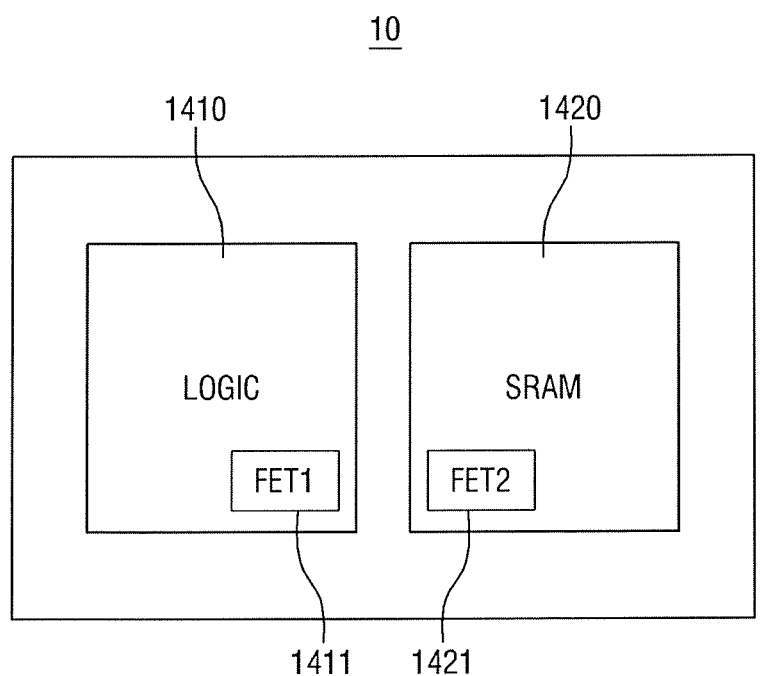
FIG. 13 is a view of a semiconductor device according to an exemplary embodiment of the present inventive concept.
Figure 14:
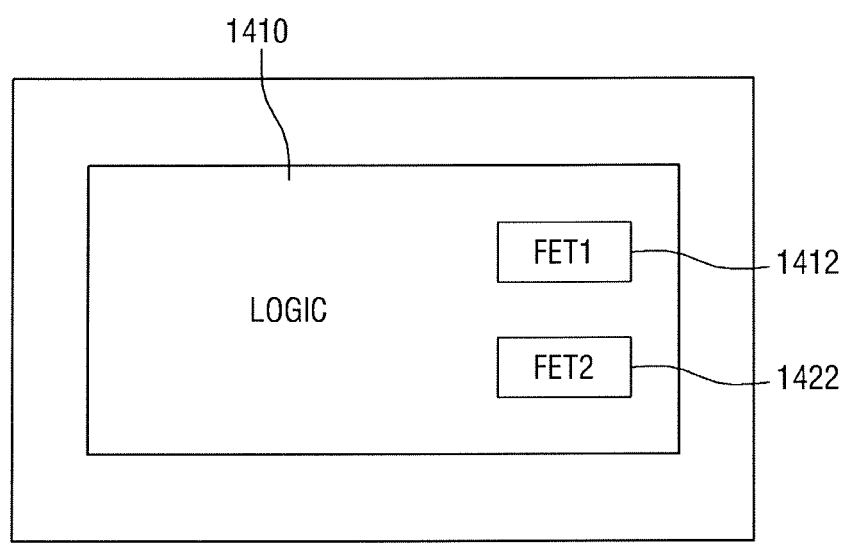
FIG. 14 is a view of a semiconductor device according to an exemplary embodiment of the present inventive concept.

FIG. 13 is a view of a semiconductor device according to an exemplary embodiment of the present inventive concept and FIG. 14 is a view of a semiconductor device according to an exemplary embodiment of the present inventive concept. Hereinafter, descriptions of the same content as that in the previous exemplary embodiments will be omitted, and the following description will focus on differences between the present and previous embodiments.

First, referring to FIG. 13, the semiconductor device 10 may include a logic region 1410 and a static random access memory (SRAM) forming region 1420. A first transistor 1411 may be disposed in the logic region 1410 and a second transistor 1421 may be disposed in the SRAM forming region 1420.

In an exemplary embodiment of the present inventive concept, the first transistor 1411 and the second transistor 1421 may have different conductivity types. Alternatively, the first transistor 1411 and the second transistor 1421 may have the same conductivity type. The semiconductor device 10 may include the semiconductor devices 1 to 9 according to an exemplary embodiment of the present inventive concept.

Next, referring to FIG. 14, the semiconductor device 11 may include a logic region 1410, and third and fourth transistors 1412 and 1422, which are different from each other, may be disposed in the logic region 1410. Although not shown, third and fourth transistors 1412 and 1422, which are different from each other, may be disposed in an SRAM forming region as well.

In an exemplary embodiment of the present inventive concept, the third transistor 1412 and the fourth transistor 1422 may have different conductivity types. Alternatively, the third transistor 1412 and the fourth transistor 1422 may have the same conductivity type. The semiconductor device 11 may include the semiconductor devices 1 to 9 according to an exemplary embodiment of the present inventive concept.

Referring back to FIG. 13, the logic region 1410 and the SRAM forming region 1420 are illustrated, but aspects of the present inventive concept are not limited thereto. For example, the present inventive concept may also be applied to the logic region 1410 and a region where other types of memories are formed. For example, the semiconductor device 10 may include a dynamic random access memory (DRAM), a magnetoresistive random access memory (MRAM), a resistive random access memory (RRAM), or a phase-change memory (PRAM).

Figure 15:
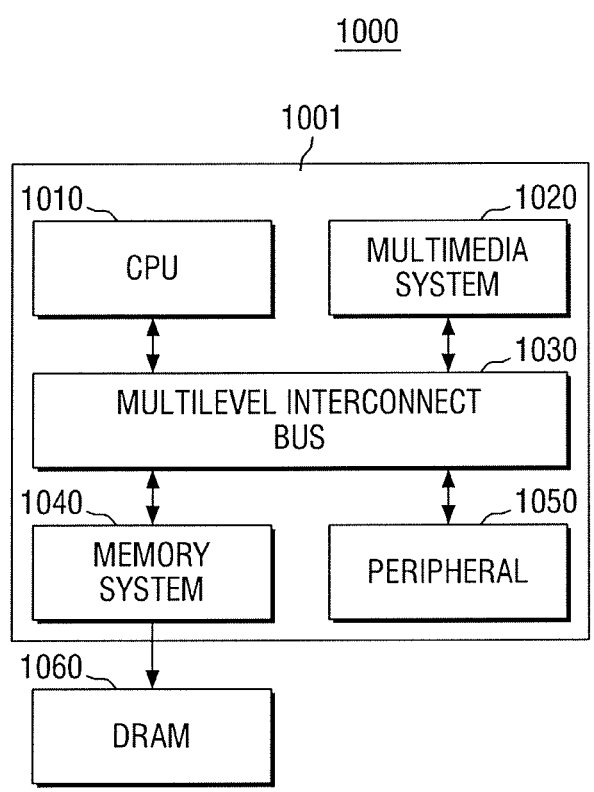
FIG. 15 is a block diagram of a system-on-a-chip (SoC) system including a semiconductor device according to an exemplary embodiment of the present inventive concept.

FIG. 15 is a block diagram of a system-on-a-chip (SoC) system including a semiconductor device according to an exemplary embodiment of the present inventive concept.

Referring to FIG. 15, the SoC system 1000 may include an application processor 1001 and a DRAM 1060.

The application processor 1001 may include a central processing unit (CPU) 1010, a multimedia system 1020, a multilevel interconnect bus 1030, a memory system 1040, and a peripheral circuit 1050.

The CPU 1010 may perform arithmetic operations necessary for operating the SoC system 1000. In an exemplary embodiment of the present inventive concept, the CPU 1010 may include a multi-core environment including two or more cores.

The multimedia system 1020 may be used in performing a variety of multimedia functions in the SoC system 1000. The multimedia system 1020 may include a three-dimensional (3D) engine module, a video codec, a display system, a camera system, and a post-processor.

The multilevel interconnect bus 1030 may be used in performing data communication among the CPU 1010, the multimedia system 1020, the memory system 1040, and the peripheral circuit 1050. In an exemplary embodiment of the present inventive concept, the multilevel interconnect bus 1030 may have a multi-layered structure. For example, the bus 1030 may include a multi-layer advanced high-performance bus (AHB), or a multi-layer advanced eXtensible interface (AXI), but aspects of the present inventive concept are not limited thereto.

The memory system 1040 may provide environments necessary for high-speed operation by connecting the AP 1001 to an external memory (for example, the DRAM 1060). In an exemplary embodiment of the present inventive concept, the memory system 1040 may include a separate controller (for example, a DRAM controller) for controlling the external memory (for example, the DRAM 1060).

The peripheral circuit 1050 may provide environments necessary for connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the AP 1001. In an exemplary embodiment of the present inventive concept, as illustrated, the DRAM 1060 may be disposed outside the AP 1001. For example, the DRAM 1060 may be packaged with the AP 1001 in the form of a package on package (PoP).

At least one of components of the SoC system 1000 may employ a semiconductor device according to an exemplary embodiment of the present inventive concept.

Next, an electronic system including semiconductor devices according to an exemplary embodiment of the present inventive concept will be described with reference to FIG. 16.

Figure 16:
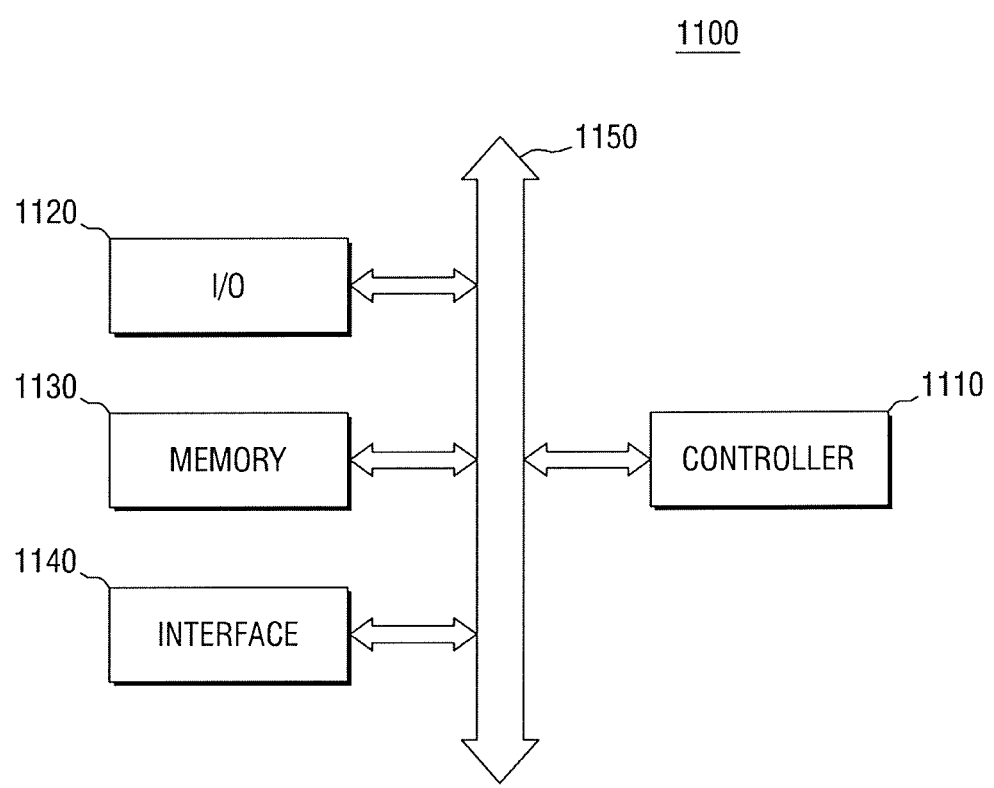
FIG. 16 is a block diagram of an electronic system including a semiconductor device according to an exemplary embodiment of the present inventive concept.

FIG. 16 is a block diagram of an electronic system including a semiconductor device according to an exemplary embodiment of the present inventive concept.

Referring to FIG. 16, the electronic system 1100 may include a controller 1110, an input/output device (I/O) 1120, a memory device 1130, an interface 1140 and a bus 1150.

The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements having functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not illustrated, the electronic system 1100 may further include high-speed DRAM and/or SRAM as the working memory for the operation of the controller 1110. Here, a semiconductor device according to an exemplary embodiment of the present inventive concept may be employed as the working memory. In addition, a semiconductor device according to an exemplary embodiment of the present inventive concept may be provided in the memory device 1130 or may be provided in the controller 1110 or the I/O 1120.

The electronic system 1100 may be applied to a personal digital assistant (PDA), a portable computer, a web tablet, a wireless phone, a mobile phone, a digital music player, a memory card, or any type of electronic device for transmitting and/or receiving information in a wireless environment.

Figure 17:
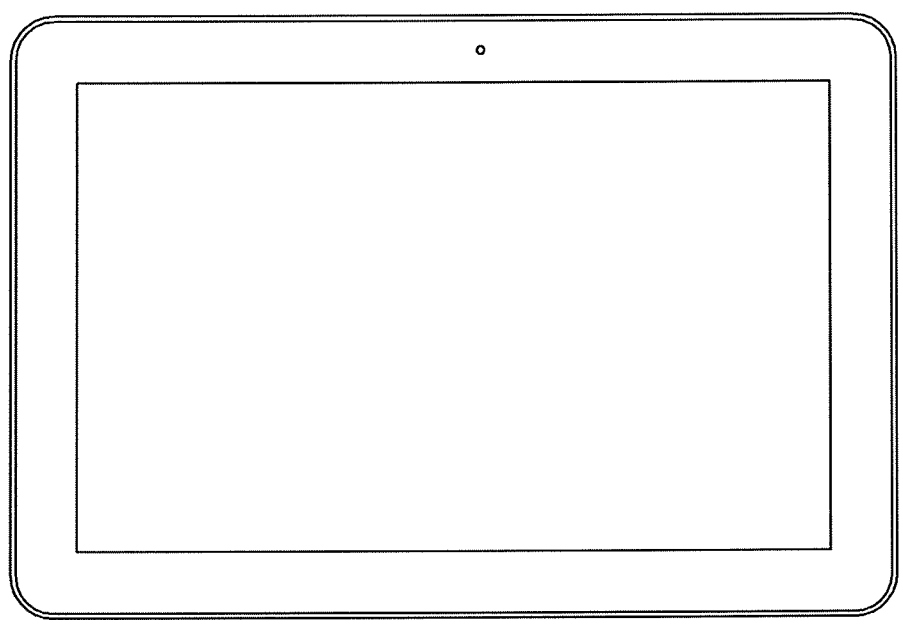
FIGS. 17 to 19 illustrate semiconductor systems including a semiconductor device according to an exemplary embodiment of the present inventive concept.
Figure 18:
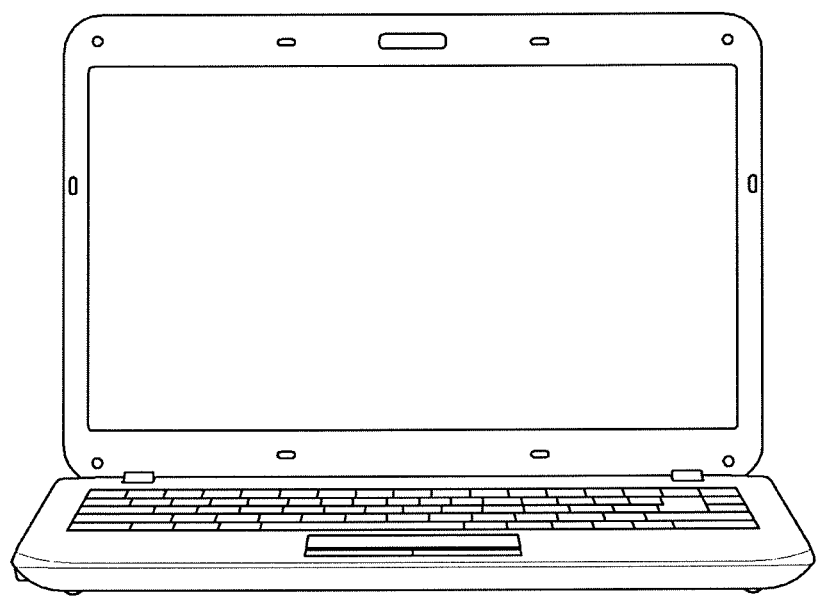
Figure 19:
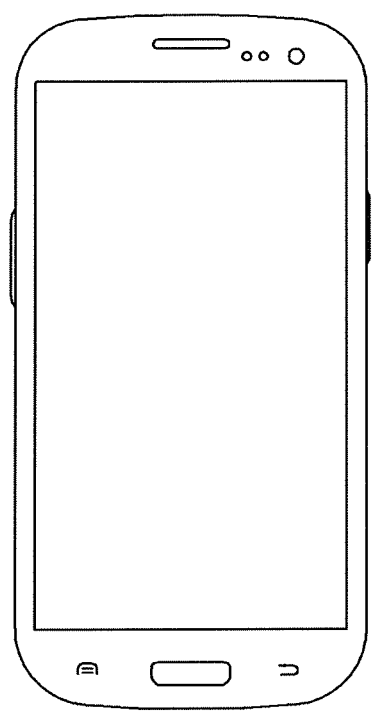

FIGS. 17 to 19 show electronic devices including a semiconductor device according to an exemplary embodiment of the present inventive concept.

FIG. 17 shows a tablet PC (1200), FIG. 18 shows a notebook computer (1300), and FIG. 19 shows a smart phone (1400). At least one of the semiconductor devices 1 to 9 according to some exemplary embodiments of the present inventive concept may be employed to a tablet PC 1200, a notebook computer 1300, a smart phone 1400, and the like.

Aspects of the present inventive concept are not limited thereto. For example, the electronic devices may be implemented as a computer, an ultra mobile personal computer (UMPC), a work station, a net-book, a personal digital assistant (PDA), a portable computer, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   a gate line;
   an active region disposed in one side of the gate line;
   a non-active region disposed in the other side of the gate line; and
   a jumper pattern crossing a top portion of the gate line and overlapping the active region and the non-active region,
   wherein a boundary between the active region and the non-active region is underneath the gate line and extends in a first direction in which the gate line extends,
   wherein the jumper pattern overlaps the boundary between the active region and the non-active region, and wherein the jumper pattern includes a first contact pattern disposed on the active region, a second contact pattern disposed on the non-active region and spaced apart from the first contact pattern, and a bridge pattern disposed on the first contact pattern and the second contact pattern and electrically connecting the first contact pattern and the second contact pattern to each other, wherein the jumper pattern further includes a blocking pattern disposed between the bridge pattern and the gate line.

2. The semiconductor device of claim 1, wherein the first contact pattern, the second contact pattern and the bridge pattern are integrally formed.

3. The semiconductor device of claim 1, wherein the first contact pattern extends in the first direction in which the gate line extends, the second contact pattern extends in the first direction, and the bridge pattern extends in a second direction crossing the first direction.

4. The semiconductor device of claim 1, further comprising a metal wire disposed on the non-active region without overlapping the active region.

5. The semiconductor device of claim 1, further comprising a gate fin disposed on the non-active region and electrically connected to the jumper pattern.

6. The semiconductor device of claim 3, wherein a combined structure of the first contact pattern, the second contact pattern and the bridge pattern forms a U-shaped connection which is in contact with the active region and the non-active region.

7. The semiconductor device of claim 4, wherein the jumper pattern is electrically connected to the metal wire.

8. The semiconductor device of claim 7, further comprising:
   a via contact disposed on the metal wire; and
   a gate fin disposed on the via contact,
   wherein the gate fin is connected electrically to the metal wire through the via contact.

9. A semiconductor device comprising:
   a first active fin and a second active fin spaced apart from each other in a first direction, wherein each of the first active fin and the second active fin extends in the first direction;
   a third active fin spaced apart from the first active fin in a second direction crossing the first direction;
   a trench disposed between the first active fin and the second active fin;
   a field insulation layer disposed in the trench; and
   a jumper pattern disposed on the first active fin, the third active fin and the field insulation layer,
   wherein the jumper pattern overlaps an end part of the first active fin and an end part of the third active fin,
   wherein the jumper pattern connects electrically the first active fin and the third active fin, and wherein the jumper pattern includes a first contact pattern disposed on the first active fin, a second contact pattern disposed on the field insulation layer and spaced apart from the first contact pattern, and a bridge pattern disposed on the first contact pattern and the second contact pattern and electrically connecting the first contact pattern and the second contact pattern to each other, wherein the jumper pattern further includes a blocking pattern touching the bridge pattern.

10. The semiconductor device of claim 9, further comprising:
a gate line extending in the second direction,
wherein the jumper pattern is disposed on the gate line, and
wherein a boundary between the first active fin and the field insulation layer is underneath the gate line.

11. The semiconductor device of claim 9, wherein the first contact pattern, the second contact pattern and the bridge pattern are integrally formed.

12. The semiconductor device of claim 9, wherein the jumper pattern is in contact with a top surface of the first active fin and a top surface of the field insulation layer.

13. The semiconductor device of claim 9, further comprising:
a metal wire disposed on the field insulation layer without overlapping the first active fin, the second active fin and the third active fin;
a via contact disposed on the metal wire; and
a gate fin disposed on the via contact,
wherein the gate fin is connected electrically to the metal wire through the via contact.

14. The semiconductor device of claim 13, wherein each of the jumper pattern and the metal wire includes a conductive material.

15. A semiconductor device, comprising:
a first active region including a first active fin and a second active fin;
a second active region spaced apart from the first active region in a first direction, wherein the second active region includes a third active fin;
a first gate line crossing the first active fin and the second active fin;
a diffusion preventing region interposed between the first active region and the second active region, wherein the diffusion preventing region extends in a second direction crossing the first direction;
a jumper pattern connecting electrically the first active fin and the second active fin, overlapping the diffusion preventing region, an end part of the first active fin and an end part of the second active fin; and
a metal wire disposed within the diffusion preventing region; and
a field insulation layer in the diffusion preventing region, wherein the field insulation layer is interposed between the end part of the first active fin and an end part of the third active fin and at least a part of the field insulation layer is overlapped with the first gate line,
wherein the metal wire is connected to the jumper pattern, and
wherein the jumper pattern is in contact with a top surface of the field insulation layer.

16. The semiconductor device of claim 15, further comprising:
the first gate line extending in the second direction, wherein a first boundary between the first active fin and the diffusion preventing region is disposed underneath the first gate line;
a second gate line extending in the second direction, wherein a second boundary between the third active fin and the diffusion preventing region is disposed underneath the second gate line; and
wherein the second active region further includes a third gate line spaced apart from the second gate line.

17. The semiconductor device of claim 16, further comprising:
a gate fin connecting electrically the metal wire and the third gate line,
wherein the gate fin is disposed on the diffusion preventing region and the second active region, crossing the second boundary and the second gate line.

18. The semiconductor device of claim 16, wherein each of the first gate line and the second gate line is a dummy gate line.

19. The semiconductor device of claim 17, further comprising:
a via contact connecting electrically the metal wire and the gate fin.

* * * * *